(12) United States Patent
Wang et al.

(10) Patent No.: US 10,008,652 B2
(45) Date of Patent: Jun. 26, 2018

(54) LIGHT EMITTING DIODE DEVICE WITH RECONSTITUTED LED COMPONENTS ON SUBSTRATE

(71) Applicant: Invensas Corporation, San Jose, CA (US)

(72) Inventors: Liang Wang, Milpitas, CA (US); Eric Tosaya, Fremont, CA (US)

(73) Assignee: INVENSAS CORPORATION, San Jose, CA (US)

( * ) Notice: Subject to any disclaimer, the term of this patent is extended or adjusted under 35 U.S.C. 154(b) by 0 days. days.

(21) Appl. No.: 15/469,518

(22) Filed: Mar. 25, 2017

(65) Prior Publication Data

US 2017/0200877 A1    Jul. 13, 2017

Related U.S. Application Data

(63) Continuation of application No. 14/338,327, filed on Jul. 22, 2014, now Pat. No. 9,620,436.

(60) Provisional application No. 61/977,384, filed on Apr. 9, 2014.

(51) Int. Cl.
| | |
|---|---|
| *H01L 33/00* | (2010.01) |
| *H01L 33/62* | (2010.01) |
| *H01L 25/075* | (2006.01) |
| *H01L 21/66* | (2006.01) |
| *H01L 33/40* | (2010.01) |
| *G01R 31/26* | (2014.01) |

(52) U.S. Cl.
CPC .......... *H01L 33/62* (2013.01); *G01R 31/2635* (2013.01); *H01L 22/14* (2013.01); *H01L 22/32* (2013.01); *H01L 25/0753* (2013.01); *H01L 33/0095* (2013.01); *H01L 33/405* (2013.01)

(58) Field of Classification Search
CPC . H01L 33/62; H01L 25/0753; H01L 33/0095; H01L 22/14; H01L 33/405
USPC .............................................. 257/98, 99, 100
See application file for complete search history.

(56) References Cited

U.S. PATENT DOCUMENTS

| | | | |
|---|---|---|---|
| 4,926,241 A | 5/1990 | Carey | |
| 5,354,955 A | 10/1994 | Gregor et al. | |
| 7,811,491 B2 | 10/2010 | Takase et al. | |
| 7,868,440 B2 | 1/2011 | Roberts et al. | |
| 8,357,960 B1 | 1/2013 | Dutta | |
| 8,669,698 B2 | 3/2014 | Shimada et al. | |
| 9,171,882 B2 | 10/2015 | Akimoto et al. | |
| 9,366,390 B2 | 6/2016 | Kuo et al. | |
| 9,461,201 B2* | 10/2016 | Heikman | H01L 33/46 |
| 9,673,363 B2* | 6/2017 | Donofrio | H01L 33/60 |
| 2003/0201462 A1* | 10/2003 | Pommer | G02B 6/4201 |
| | | | 257/200 |
| 2003/0234452 A1 | 12/2003 | Tao et al. | |
| 2005/0017250 A1* | 1/2005 | Nitta | H01L 33/16 |
| | | | 257/79 |
| 2006/0268567 A1* | 11/2006 | Jang | G02B 6/0031 |
| | | | 362/555 |

(Continued)

*Primary Examiner* — Viet Q Nguyen
(74) *Attorney, Agent, or Firm* — Forefront IP Lawgroup of Christie & Rivera, PLLC; Emmanuel A. Rivera

(57) ABSTRACT

Disclosed herein are technologies for forming a plurality of known good die (KGD)-light emitting diode (LED) components into a larger size optically coherent LED chips or devices. This Abstract is submitted with the understanding that it will not be used to interpret or limit the scope or meaning of the claims.

17 Claims, 15 Drawing Sheets

(56) References Cited

U.S. PATENT DOCUMENTS

| | | | |
|---|---|---|---|
| 2008/0290351 A1* | 11/2008 | Ajiki | H01L 25/0753 257/88 |
| 2009/0207875 A1 | 8/2009 | Nagasaka | |
| 2010/0052189 A1 | 3/2010 | Sakurai et al. | |
| 2010/0148198 A1 | 6/2010 | Sugizaki et al. | |
| 2010/0155917 A1 | 6/2010 | Maruo | |
| 2010/0207142 A1 | 8/2010 | Chen et al. | |
| 2010/0230711 A1 | 9/2010 | Kuo et al. | |
| 2011/0156191 A1* | 6/2011 | Lin | H01L 21/76898 257/433 |
| 2012/0112220 A1* | 5/2012 | West | H01L 33/46 257/98 |
| 2012/0193662 A1* | 8/2012 | Donofrio | H01L 33/60 257/98 |
| 2012/0241921 A1 | 9/2012 | Lee et al. | |
| 2013/0285077 A1* | 10/2013 | Kojima | H01L 25/0753 257/88 |
| 2013/0329440 A1* | 12/2013 | Tsutsumi | H01L 24/97 362/465 |
| 2014/0027807 A1 | 1/2014 | Tasaki et al. | |
| 2014/0110728 A1 | 4/2014 | Lee et al. | |
| 2014/0353705 A1* | 12/2014 | Kamikawa | H01L 33/007 257/98 |
| 2015/0333230 A1* | 11/2015 | Moon | H01L 27/156 257/88 |

\* cited by examiner

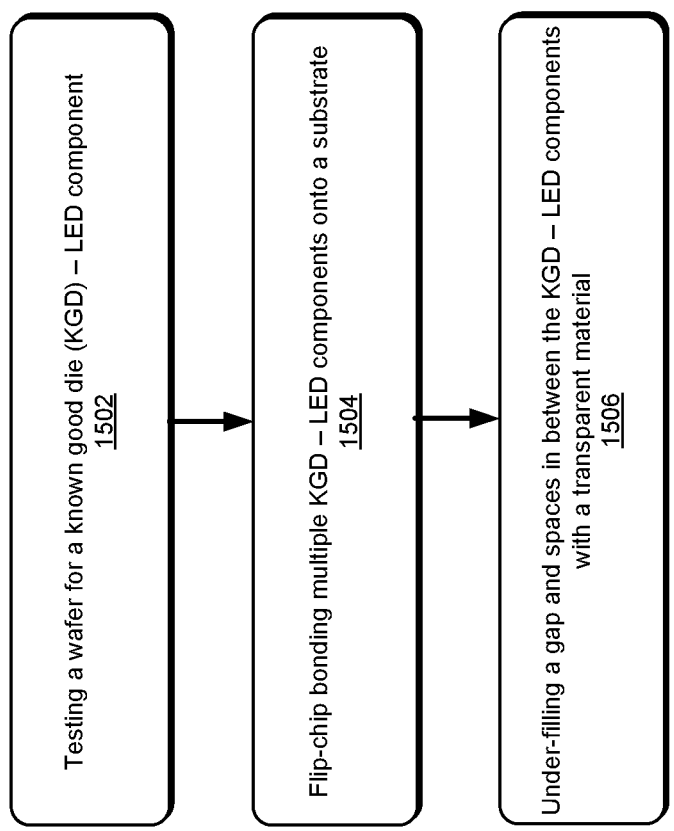

LIGHT EMITTING DIODE DEVICE WITH RECONSTITUTED LED COMPONENTS ON SUBSTRATE

RELATED APPLICATIONS

This application claims the benefit of priority of U.S. Provisional Patent Application Ser. No. 61/977,384 filed Apr. 9, 2014, and U.S. patent application Ser. No. 14/338,327 filed Jul. 22, 2014.

BACKGROUND

Light emitting diodes (LEDs) are gaining wide acceptance in a variety of area-illumination applications such as in architectural lighting, residential illumination, industrial lighting, outdoor lighting, and the like.

A typical LED is made of semiconducting materials doped with impurities to create a p-n junction. As in other diodes, current flows easily from the p-side, or anode, to the n-side, or cathode, but not in the reverse direction. Charge-carriers such as electrons and holes may flow into the p-n junction from electrodes with different voltages. When an electron meets a hole, for example, it falls into a lower energy level and releases energy in the form of a photon.

For high-brightness applications, a large LED chip size is preferable. More importantly, with larger LED chip size, higher brightness may be achieved at much lower current density which leads to less degradation of efficacy. However simply increasing the die size of LEDs causes significant yield loss and thus hinders the adoption of big-chip LEDs.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

FIG. 15 is a diagram of an example method-flowchart of joining a plurality of KGD-LED components as described in present implementations herein.

DETAILED DESCRIPTION

Described herein are processes and method of forming a plurality of known good die (KGD)-light emitting diode (LED) components into a larger size optically coherent LED chips or devices.

In an implementation, a wafer testing may provide a multiple of KGD-LED components. In this implementation, the KGD-LED components are singulated and flip chip bonded onto a mounting substrate, which includes redistribution layers (RDLs) that facilitate electrical connections between the KGD-LED components and an operating device. For example, the electrical connections facilitated by the RDLs may include series or parallel connections of the KGD-LED components to a circuitry, power source, or components of the operating device.

With the KGD-LED components bonded onto the mounting substrate, a gap and spaces in between the bonded KGD-LED components are under-filled with a transparent material (e.g., silicon or epoxy). The gap, for example, is configured to include a measurement such that it facilitates free flowing of the transparent under-filling materials (e.g., equal or less than 100 um) in between the aligned and mounted KGD-LED components. After a curing process, a surface of the transparent filling material may be roughened for purposes of light extraction. Similarly, an upper surface and a lower surface of a substrate in a stack of LED layers that forms the KGD-LED component are roughened and patterned, respectively, for purposes of this light extraction (e.g., about 1-3 um in roughness). The transparent material filling the gap is transparent to the light wavelength that is emitted by the LED components. The transparent material may be customized as to not absorb the LED light wavelength, otherwise there may be poor light output by the device. In addition, the gap dimension between the KGD-LED components, the shape of the KGD, pattern of the KGD, or combination, may be configured to facilitate free flowing of the transparent under-filling material.

The formed or joined plurality of KGD-LED components above may allow for scalability to increasingly larger LED chip or device size; high efficacy; high brightness; high yield; and low cost.

FIGS. 1-15 depict one illustrative method of joining a plurality of KGD-LED components including into a larger size optically coherent LED chips or devices.

For example, FIGS. 1-5 initially depict an illustrative situation where metal contacts are formed into the n-type and p-type gallium nitride (GaN) surfaces of stack of LED layers.

Figure 1:
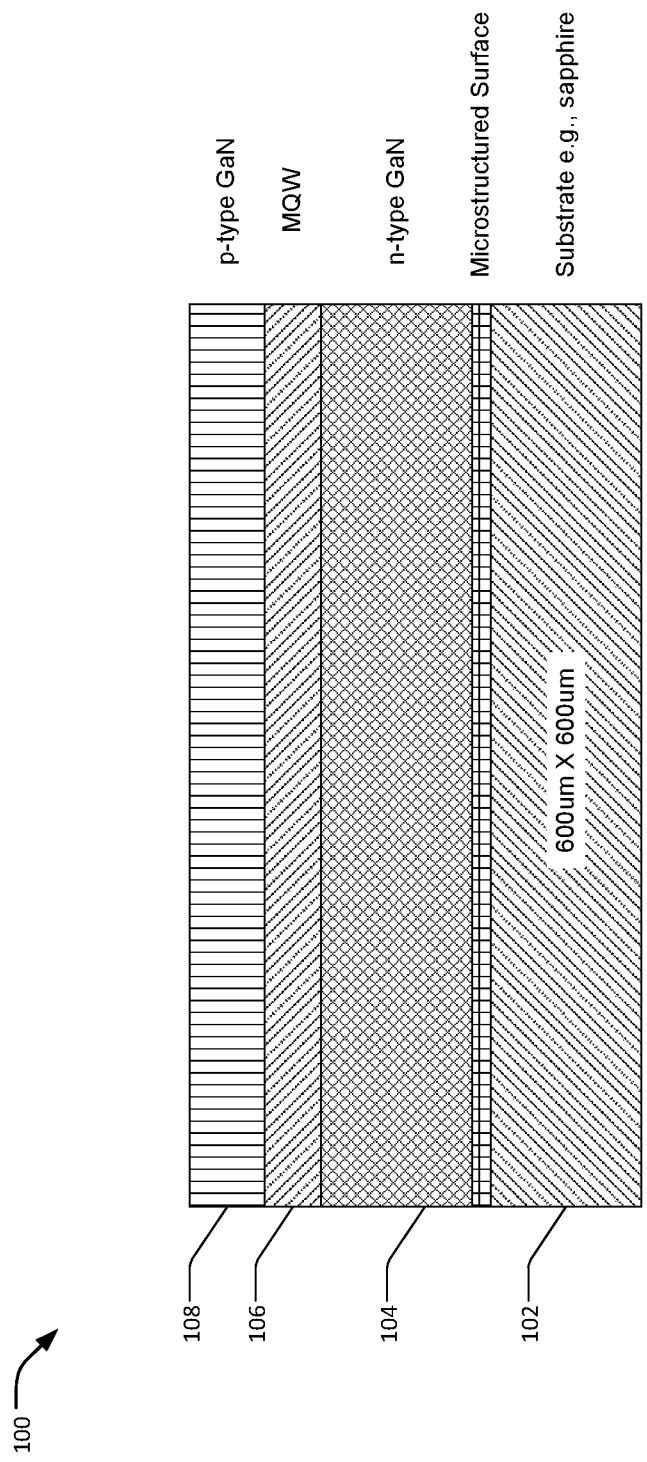
FIG. 1 is a diagram of an example metal organic chemical vapor deposition (MOCVD) stack as described in present implementations herein.

FIG. 1, in this example, shows a MOCVD stack 100 (i.e., stack of LED layers) that includes a substrate 102, n-type GaN 104, a MQW 106, and a p-type GaN 108.

In accordance with embodiment described herein, the sequential formation of the n-type GaN 104, MQW 106, and the p-type GaN 108 into or above the substrate 102 may be implemented via any suitable processes and materials. For example, the substrate 102 may include a crystalline material such as in the case of sapphire or silicon carbide (SiC) substrates where the crystalline material is lattice matched to the GaN materials (i.e., n-type GaN 104 and p-type GaN 108). In this example, the substrate 102 may have a microstructured surface. On the other hand, the n-type GaN 104 and the p-type GaN 108 may include the same or different semiconducting materials and they may either be doped or undoped, or doped with different dopant materials. In general, the semiconducting materials n-type GaN 104 and the p-type GaN 108 may be formed by forming a hard mask (not shown) such as, for example, a silicon nitride hard mask.

The MQW 106, for example, may include different bandgaps and thicknesses depending upon their number of quantum wells and barriers. According to the present disclosure, the number of quantum wells and barriers, and their thicknesses may be adjusted to controllably vary the intensity ratio of the emitted photons of different energies (wavelengths). As a consequence, the MQW 106 may be tailored so as to emit light of multiple wavelength bands which are combinable to yield a light of a desired color. It is to be appreciated that embodiments in accordance with the present description may suit other types of LEDs that includes different materials.

Figure 2:
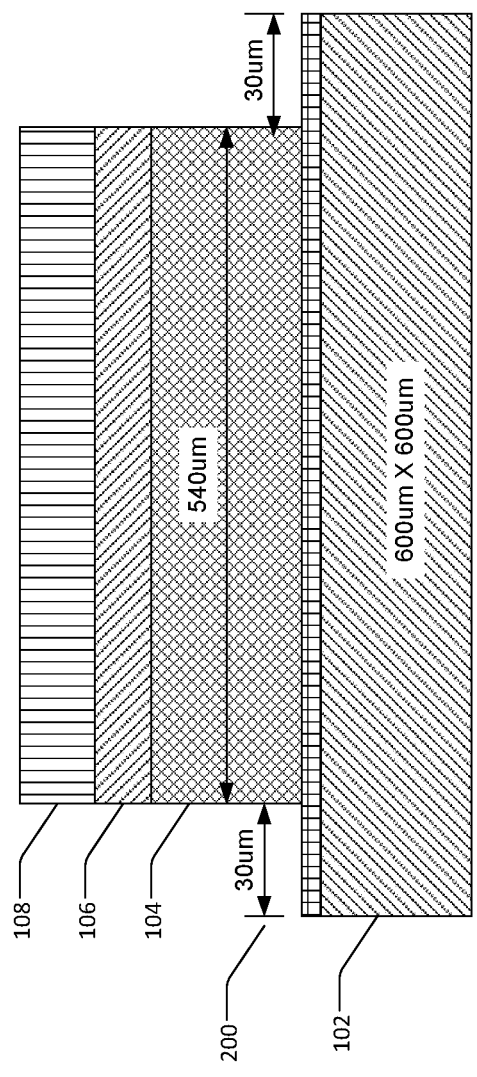
FIG. 2 is a diagram of an example etching of a gallium nitride (GaN) as described in present implementations herein.

FIG. 2 illustrates an example etching in the GaN to define a device area which may be patterned using a first mask i.e., mask layer 1.

For example, portions of the sequentially formed n-type GaN 104, MQW 106, and the p-type GaN 108 are etched away via inductively coupled plasma reactive ion etching (RIE), or other suitable process. In this example, the etching may result to a new dimension of the MOCVD stack 100. That is, an outer perimeter (i.e., upper surface) of the substrate 102 is cleared of the sequentially formed n-type GaN 104, MQW 106, and the p-type GaN 108. For example, a photolithography (i.e., mask layer 1) and a strip photoresist are used to clear a width of 30 um (i.e., shown in width 200) measured from an outer perimeter of the substrate 102. In this example, the sequentially formed n-type GaN 104, MQW 106, and the p-type GaN 108 may appear as a single unit (e.g., square) on top of the substrate 102, which may also have a square configuration (e.g., 600 um by 600 um die size).

Figure 3:
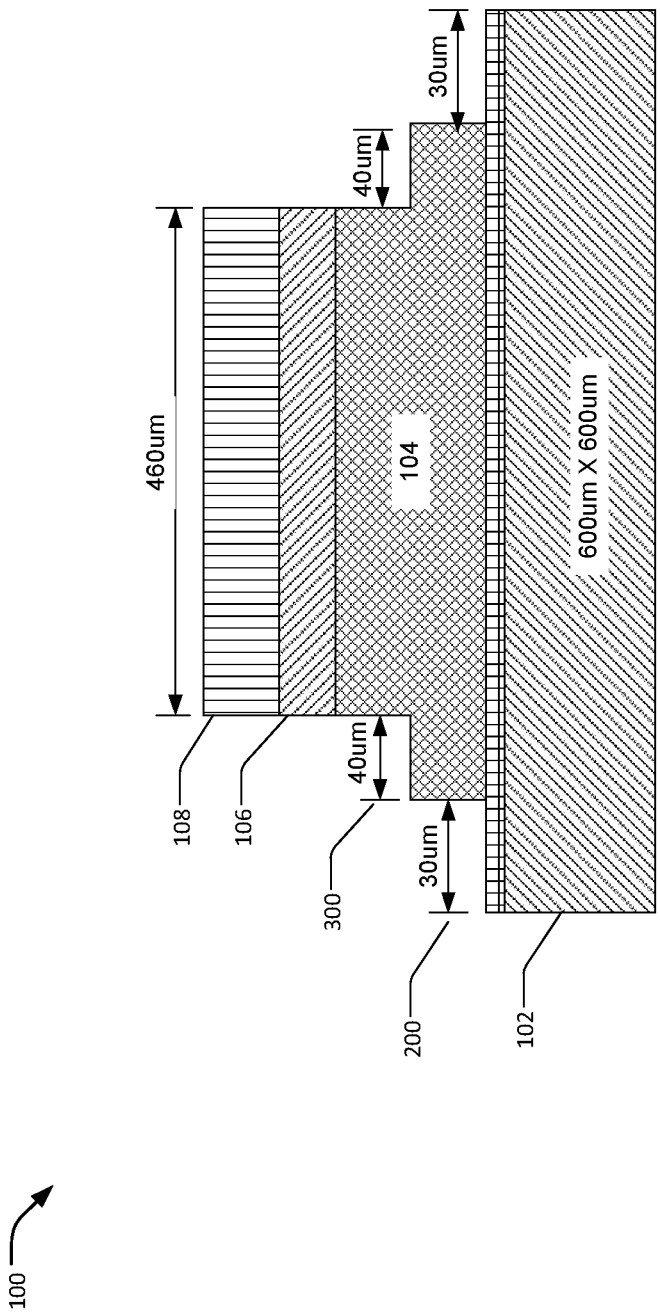
FIG. 3 is a diagram of an example etching of a GaN as described in present implementations herein.

FIG. 3 is illustrates an example etching of the GaN which may be patterned using a second mask, i.e., mask layer 2.

For example, an etching process is performed that removes materials of the p-type GaN 108, MQW 106, and a portion of the n-type GaN 104 in the stack of LED layers. At the end of the etching process, a width of 40 um (i.e., shown as width 300) may be removed from an outer perimeter of the stack of LED layers: p-type GaN 108, MQW 106, and portion of the n-type GaN 104. For example, after the etching process, the stack of LED layers—p-type GaN 108, MQW 106, and the n-type GaN 104—may appear as a square on top of the n-type GaN 104. In this example, a new truncated dimension of the n-type GaN 104 may include a lower base such as the 540 um base dimension as a result of the process in FIG. 2, and an upper base that is defined by removal of the outer perimeter (i.e., shown in width 300) of the n-type GaN 104.

Figure 4:
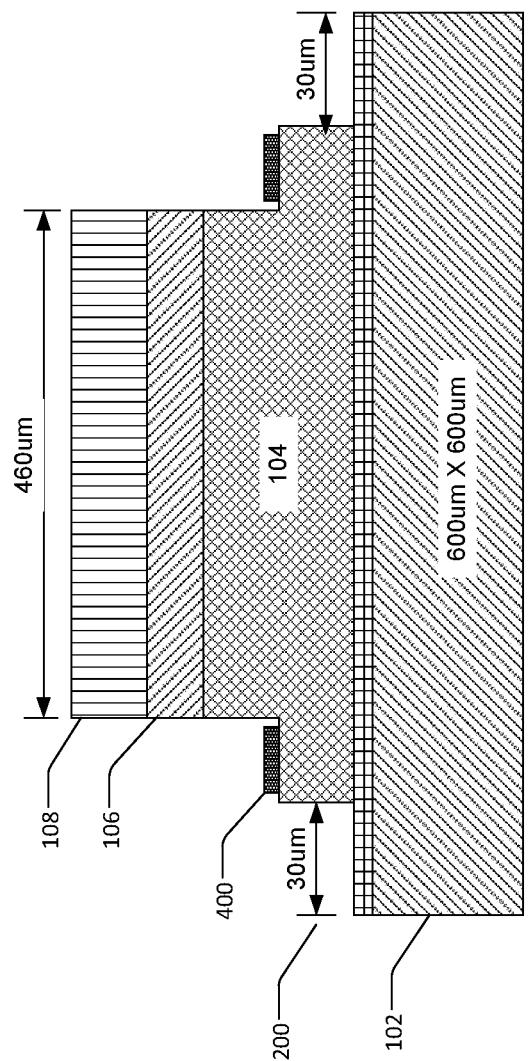
FIG. 4 is a diagram of an example formation of a metal contact for the n-type GaN as described in present implementations herein.

FIG. 4 illustrates an example formation of a metal contact for the n-type GaN which may be formed using a third mask, i.e., mask layer. FIG. 4 involves another process performed on previous FIG. 3 and to this end, the previously defined materials, removed portions, and/or processes may not be shown again to simplify the presentation.

For example, FIG. 4 illustrates formation of metal contacts 400 in the n-type GaN 104. Particularly, the metal contacts 400 are disposed on top of a planar upper surface of the lower base and within the perimeter defined by the width 300. For example, the metal contacts 400 includes a width of about 30 um and the metal contacts 400 may surround the upper base of the n-type GaN 104. In this example, the 30 um metal contacts 400 lie within the perimeter defined by the width 300.

In accordance with implementations described herein, the illustrated formation shown in FIG. 4 may be via any suitable processes and materials. For example, a deposition process using an electron beam ("e-beam") utilizes 15 nm Ti/200 nm Al/40 nm Ni/50 nm Au to form the metal contacts 400. Furthermore, a rapid thermal anneal (RTA) at 900° C. for 30 secs in a N2 environment may be utilized in the formation of the metal contacts 400. In this example, the utilized photoresists may be removed by organic solvents.

Figure 5:
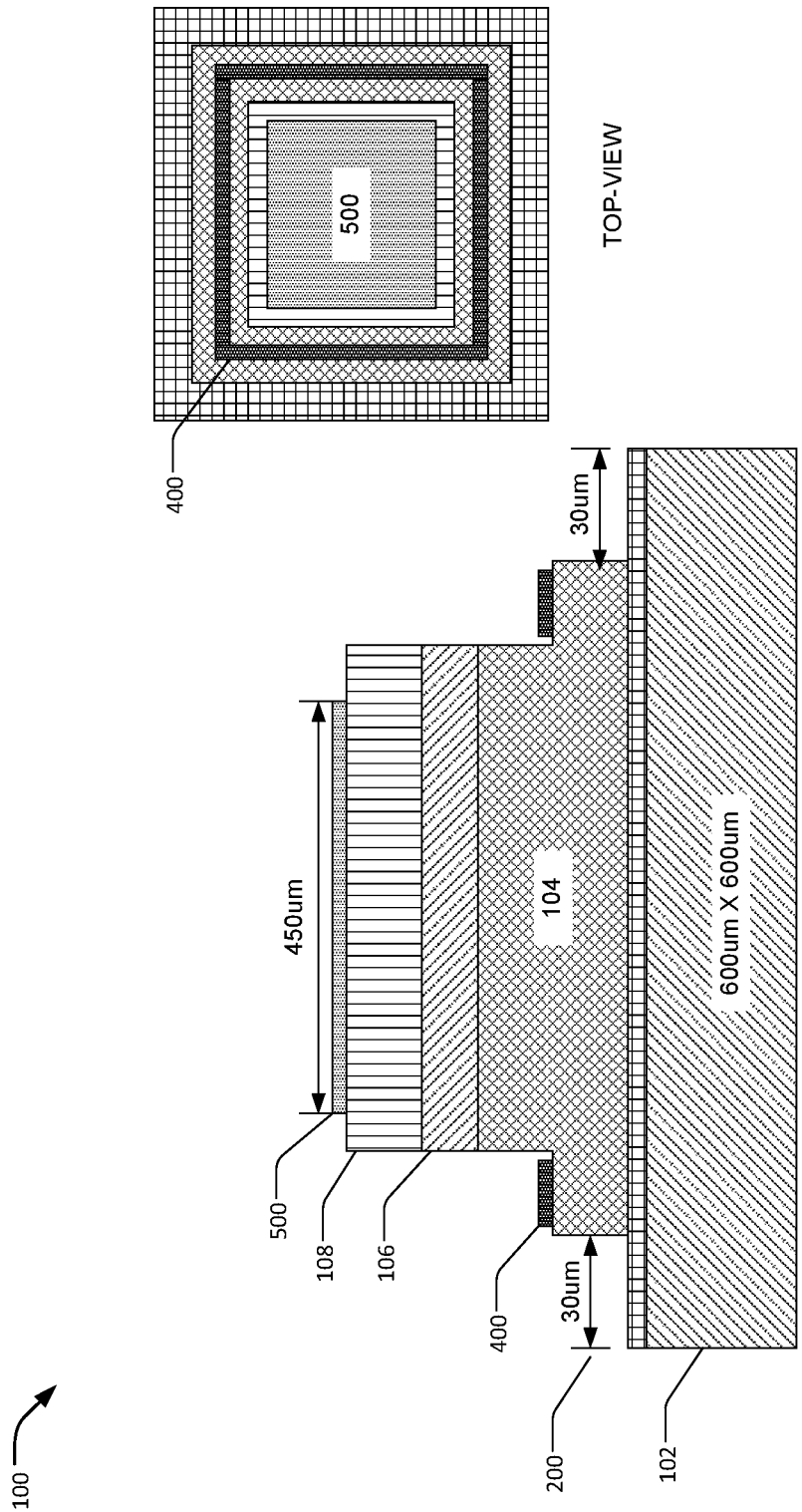
FIG. 5 is a diagram of an example formation of a metal contact for the p-type GaN as described in present implementations herein.

FIG. 5 illustrates an example formation of a metal contact for the p-type GaN which may be formed using a fourth mask, i.e., mask "layer 4. FIG. 5 involves another process performed on previous FIG. 4 and to this end, the previously defined materials, removed portions, and/or processes may not be shown again to simplify the presentation.

For example, FIG. 5 illustrates formation of metal contacts 500 on a top planar surface of the p-type GaN 108. In this example, the metal contacts 500 may form a square within an area defined by the upper planar surface of the p-type GaN 108. The square formed by the metal contacts 500, for example, has a side measurement of 450 um while the square formed by the p-type GaN 108 has a side measurement of 460 um (i.e., larger by 5 um). A top-view diagram as shown in FIG. 5 may illustrate the configuration of the metal contacts 400 and 500.

In an implementation, the following techniques or process may be implemented to form the metal contacts 500: photolithography to expose the metal contact formation regions, roughening of the p-type GaN surface to induce, enhance, and/or optimize diffusive reflection; E-beam evaporate 20 nm Pd (or Ni)/500 nmAl/40 nm Ni/50 nm Au to form the metal contacts 500; liftoff of the photoresist by organic solvents; and annealing process that utilizes nitrogen at 550° C. for 5 minutes.

Figure 6:
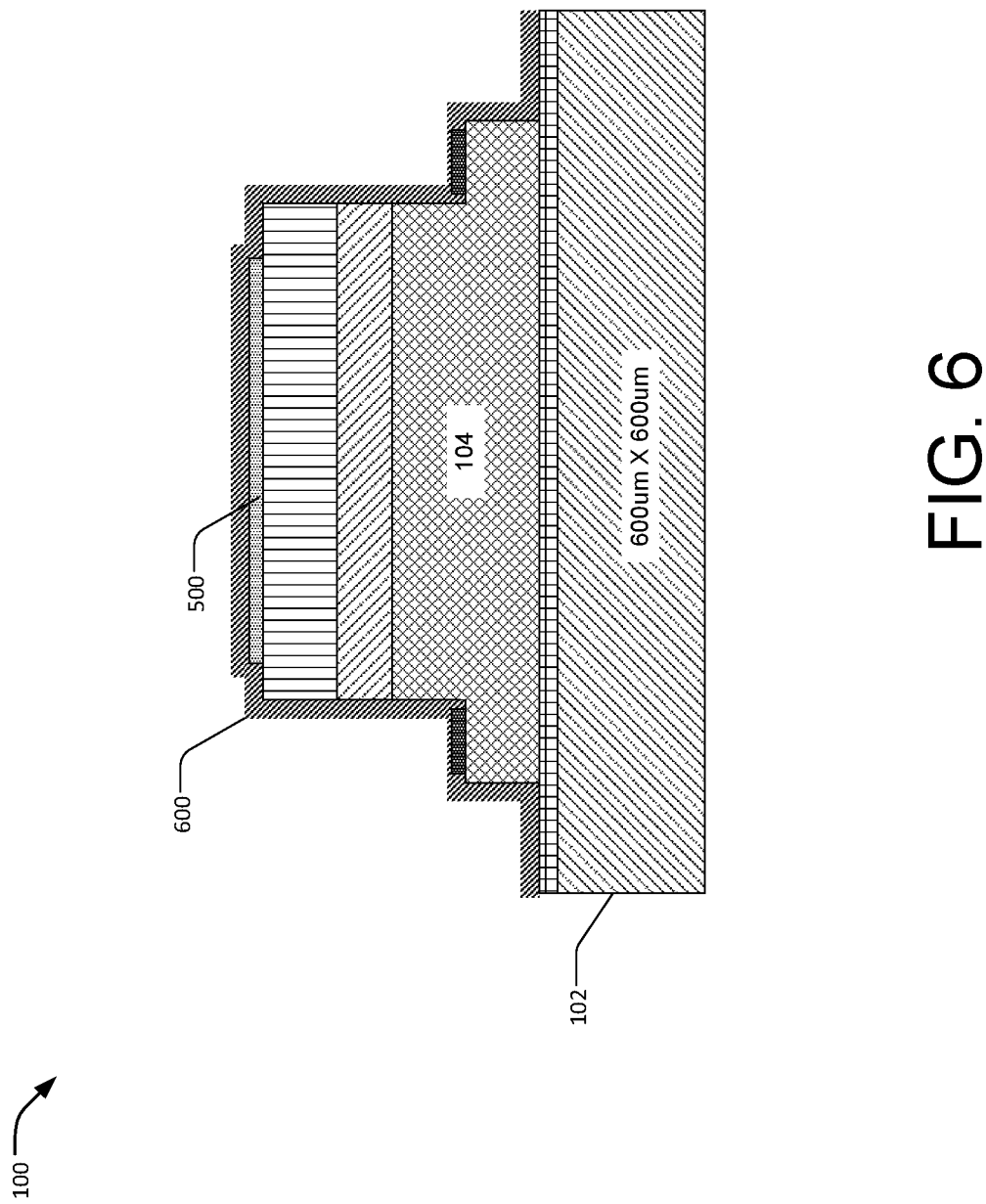
FIG. 6 is a diagram of an example formation of a dielectric material for isolation purposes.

FIG. 6 illustrates an example formation of a dielectric 600 for isolation purposes. FIG. 6 involves another process performed on previous FIG. 5 and to this end, the previously defined materials, removed portions, and/or processes may not be shown again to simplify the presentation.

For example, the formation of the dielectric 600 may involve depositing 500 nm of silicon dioxide (SiO2) with a uniform coverage on the top and step side walls of the resulting stack of LED layers or materials. In this example, the selection of particular dielectric material and process control is implemented to obtain low stress and step coverage.

Figure 7:
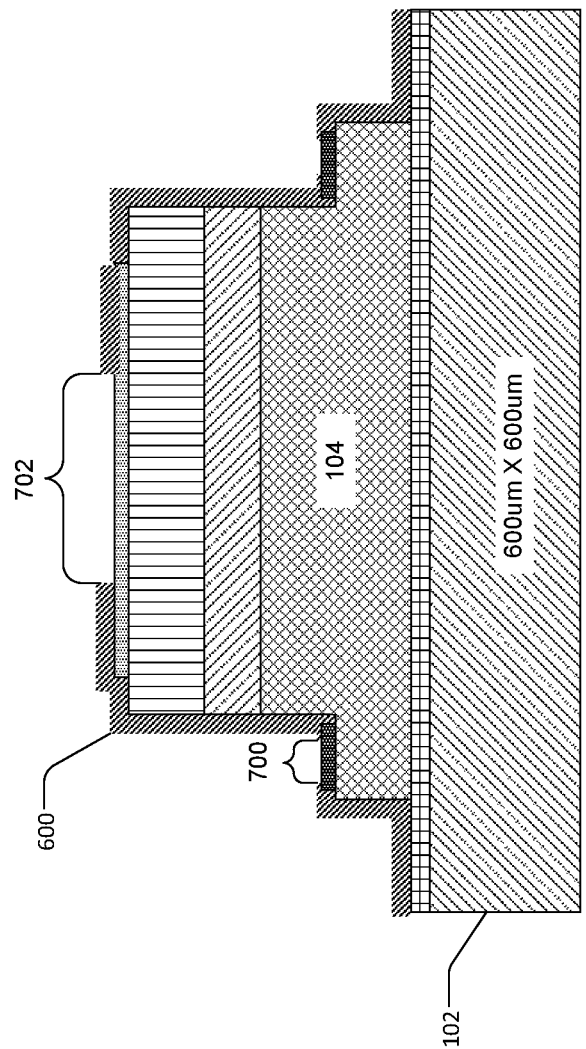
FIG. 7 is a diagram of an example etching of a dielectric to expose a metal contact as described in present implementations herein.

FIG. 7 illustrates an example etching of the formed dielectric 600 to expose metal contacts which may be patterned using a fifth mask, i.e., "mask layer 5." FIG. 7 involves another process performed on previous FIG. 6 and to this end, the previously defined materials, removed portions, and/or processes may not be shown again to simplify the presentation.

In an implementation, a photolithographic process, a wet and/or dry etching processes may be used to selectively etch the dielectric 600 from the top surfaces of the resulting stack of LED layers. For example, a first opening width 700 defines a width of the etched dielectric 600 that exposes the metal contacts 400. In this example, the first opening width may include about 20 um in measurement.

In another example, a second opening width 702 defines a width of the etched dielectric 600 that exposes the metal contacts 500. In this example, the second opening width 702 may be less than 100 um in measurement.

Figure 8:
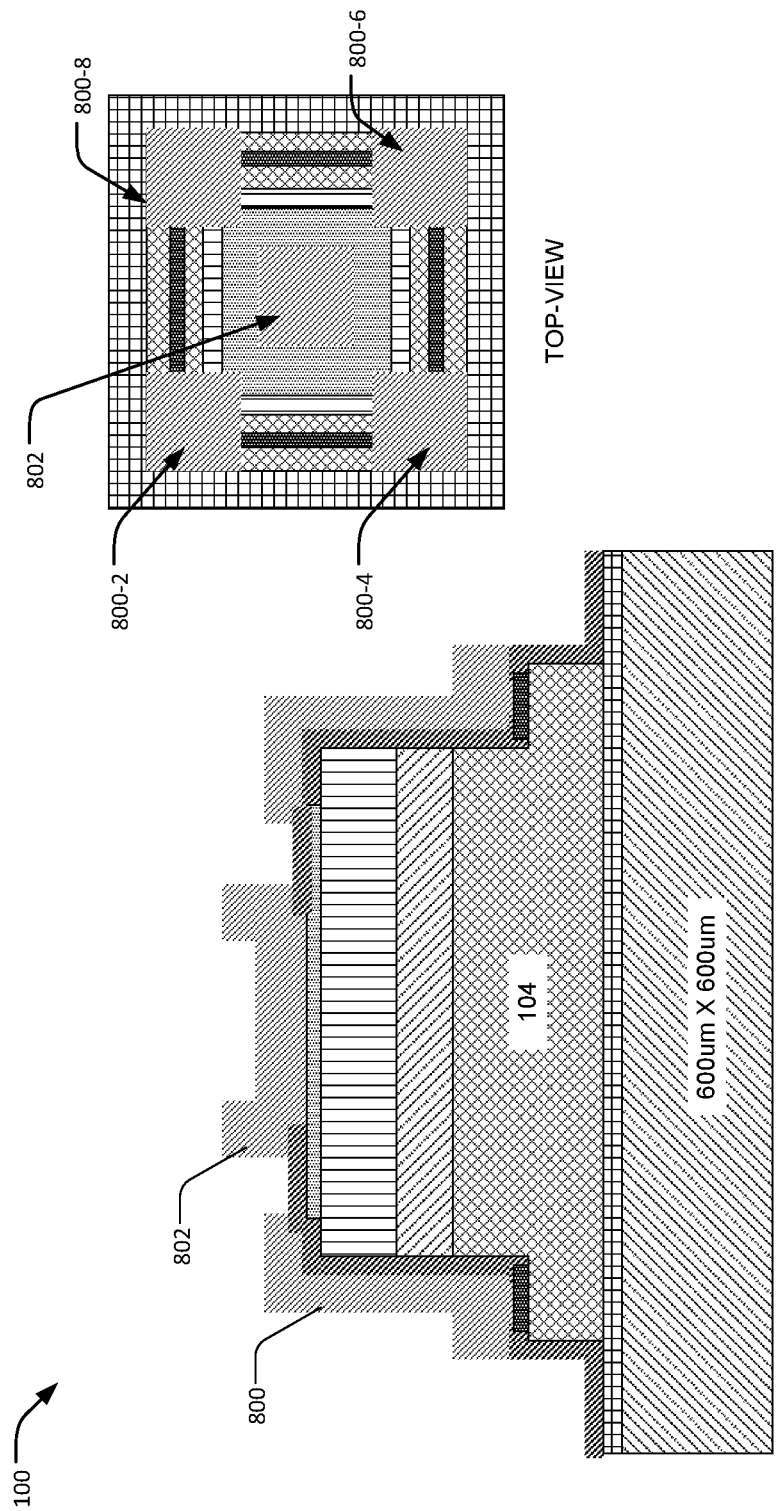
FIG. 8 is a diagram of an example patterning of probe pads onto metal contacts as described in present implementations herein.

FIG. 8 illustrates an example patterning of probe pads onto the metal contacts using a sixth mask, i.e., "mask layer 6." FIG. 8 involves another process performed on previous FIG. 7 and to this end, the previously defined materials, removed portions, and/or processes may are not discussed again to simplify the presentation.

In an implementation, the probe pads may include a plurality of interface pads connected to the metal contacts 400 and 500. For example, probe pads 800-2, 800-4, 800-6 and 800-8 may include the interface pads that are bonded with the metal contact 400. In another example, the probe pad 802 may include the interface pad that is bonded with the metal contact 500.

To form the probe pads 800 and 802, the following may be implemented: photolithography to expose regions where the probe pads may be formed; E-beam that utilizes 20 nm Ti/300 nm Al/200 nmNi/300 nm Au to form the bonding pads; and liftoff of the photoresist by organic solvents.

With continuing reference to FIG. 8, the probe pads 800 may be disposed at each corner of the metal contact 400 while a single probe pad 802 may be disposed at the metal contact 500. For example, the probe pads 800 and 802 may have a similar width of about 100 um.

Figure 9:
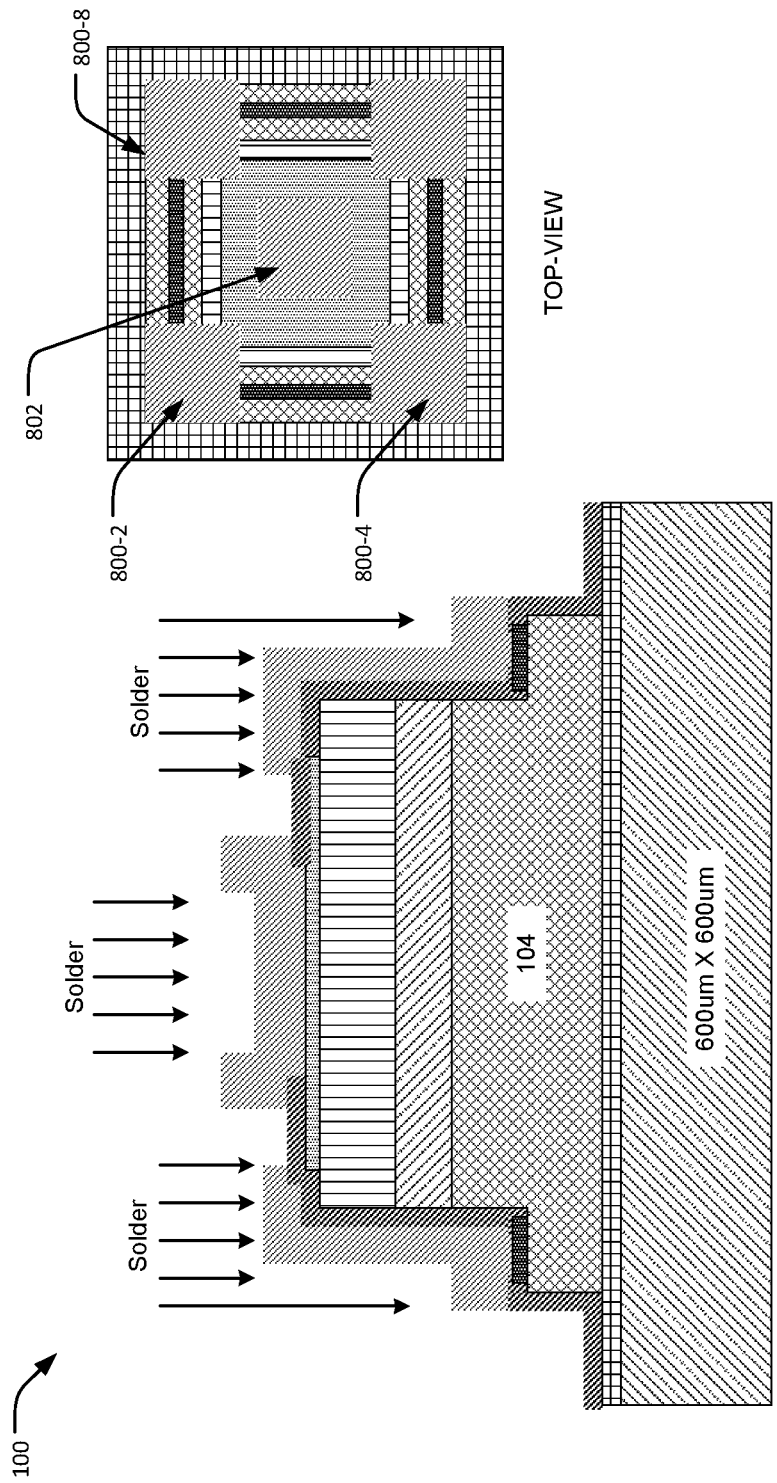
FIG. 9 is a diagram of an example optional step of electroplating of a solder bump.

FIG. 9 illustrates an example of an optional step of electroplating of a solder bump. The solder bumps (not shown), for example, may be formed on top of the probe pads 800 and 802.

In general, structures of solder bumps may be formed by performing one or more deposition processes to deposit one or more layers of barrier materials (not shown) and/or seed layers, e.g., Ti/1 um Cu, a copper seed layer, etc. above the probe pads 800 and 802. Thereafter, the solder bump structures may be subjected to one or more chemical mechanical planarization (CMP) processes to remove excess materials such as excess materials which are above 60 um in height.

In an implementation, the formed stack of LED layers, metal contacts, and the probe pads may constitute a structure of an LED device. In this implementation, a testing of dies on the wafer is performed to generate a known good die (KGD) map. The KGD map may include KGD-LED components that may be combined to form a plurality of KGD-LED components as further discussed below.

Figure 10:
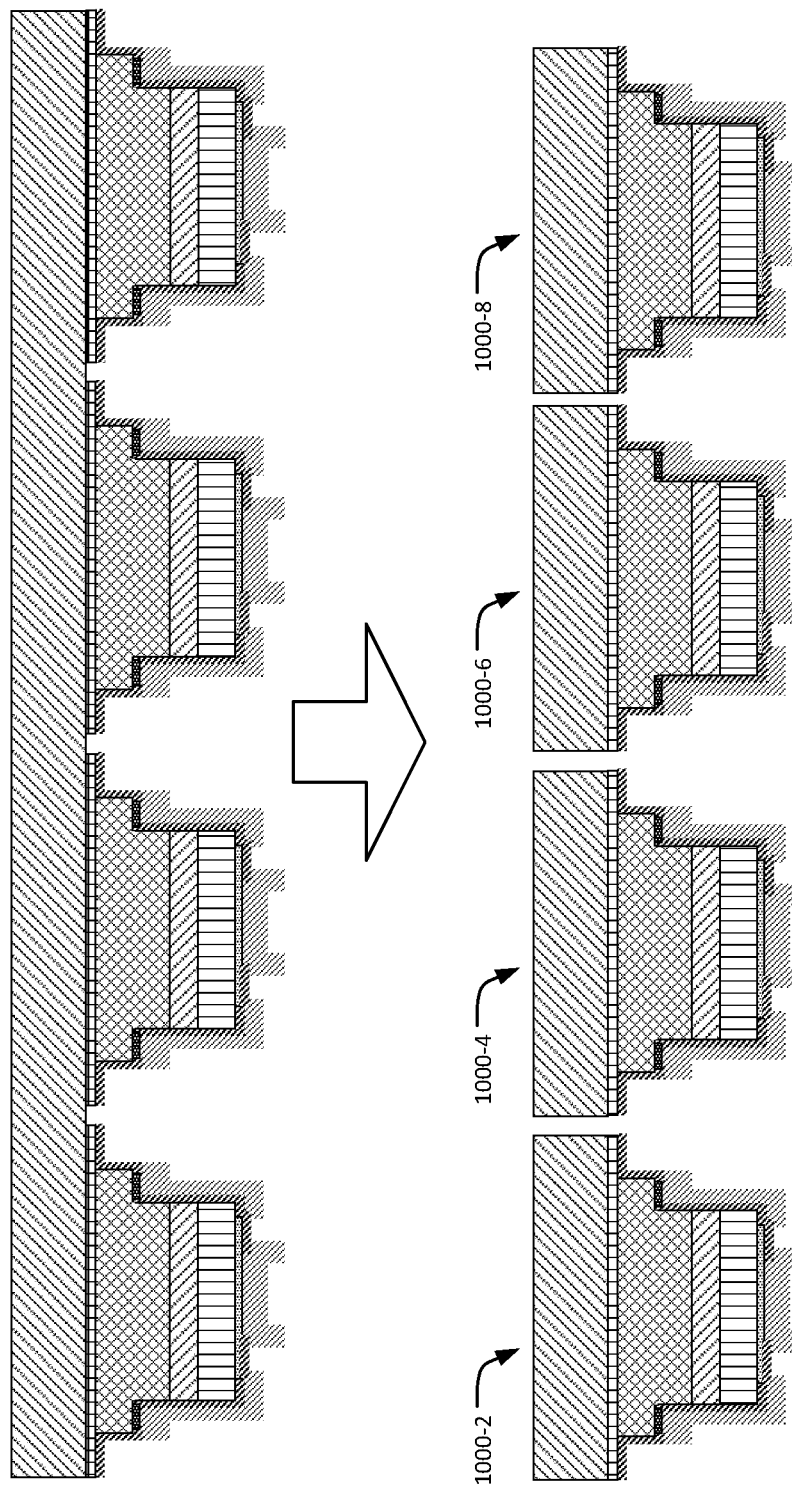
FIG. 10 is a diagram of an example process of thinning down, roughening, and singulating KGD-LED components.

FIG. 10 illustrates an example process of thinning down, roughening, and singulating KGD-LED components 1000.

In certain implementations, the substrate 102 of the stack of LED layers may be maintained at its originally provided thickness. In other implementations, the substrate 102 may be thinned to a desired thickness. For example, the substrate 102 may be grinded down to a thickness of about 200 um and subsequently polished with grit 4000 to 8000 to roughen the sapphire surface (i.e., upper surface of the substrate 102) leaving or forming a surface roughness of 1-3 micrometers. In this example, the thinning and polishing may be performed before or after a partial or full singulation/dicing process. The roughening, for example, enhances light extraction through and out of the sapphire substrate 102.

Figure 12:
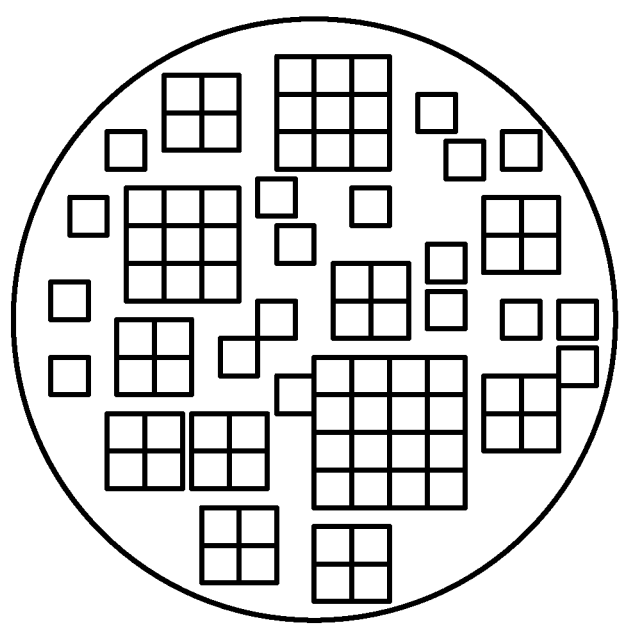
FIG. 12 is a diagram of an example multiple mounting configurations on a substrate wafer floor plan.

With continuing reference to singulated KGD-LED component 1000 as shown in FIG. 12, the singulation may utilize laser scribing that utilizes 5 um precision and 15 um kerf. Before the singulation process is performed, the front side of the multiple KGD-LED components 1000 to be singulated may be coated and protected with photoresists. In other implementations, etching, sawing, lasing, or other conventional singulation technique may be utilized to produce singulated KGD-LED components 1000-2, 1000-4, 1000-6 and 1000-8.

Figure 11:
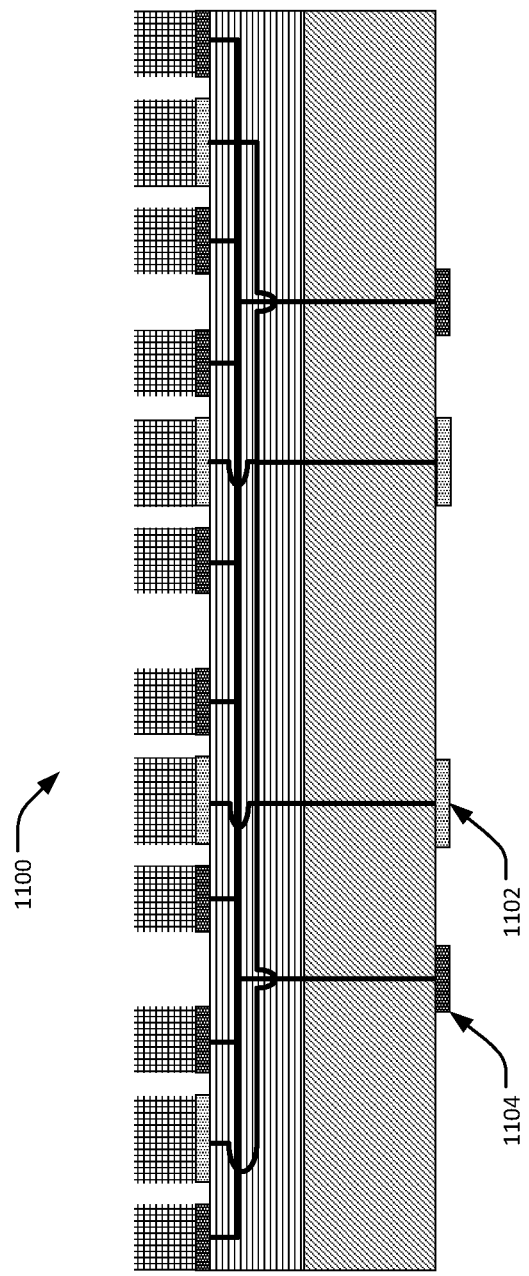
FIG. 11 is a diagram of an example mounting substrate upon which the singulated KGD-LED components may be attached or mounted.

FIG. 11 illustrates an example mounting substrate 1100 upon which the singulated KGD-LED components 1000 may be attached or mounted. The following process may be implemented to form the mounting substrate 1100. For example, a growth substrate is mounted with conductive vias 1102 and 1104 to allow interconnection of the singulated KGD-LED components 1000 to other components, circuits, power supply, etc. (not shown). In this example, the mounting substrate 1100 may include re-distributed layers (RDL) (not shown) to provide electrical connections and/or to route or re-route the multiple electrodes of the KGD-LED components 1000 to positive (+) and negative (−) electrodes of the power supply. The positive and negative electrodes, for example, are illustrated by positive electrode 1102 and negative electrode 1104, respectively.

FIG. 12 illustrates an example multiple mounting configurations on a substrate floor plan. Each site, shown as a discrete square in FIG. 12, may be configured to accept the KGD-LED component 1000. The KGD-LED component 100, for example, may be derived through IC testing procedures. Thus, varying sizes of LED devices may be obtained by orienting multiple KDG-LED components 1000 in relatively close proximity, such as in a 1×2, 2×2, 3×3, 4×4 or any suitable matrix.

Figure 13:
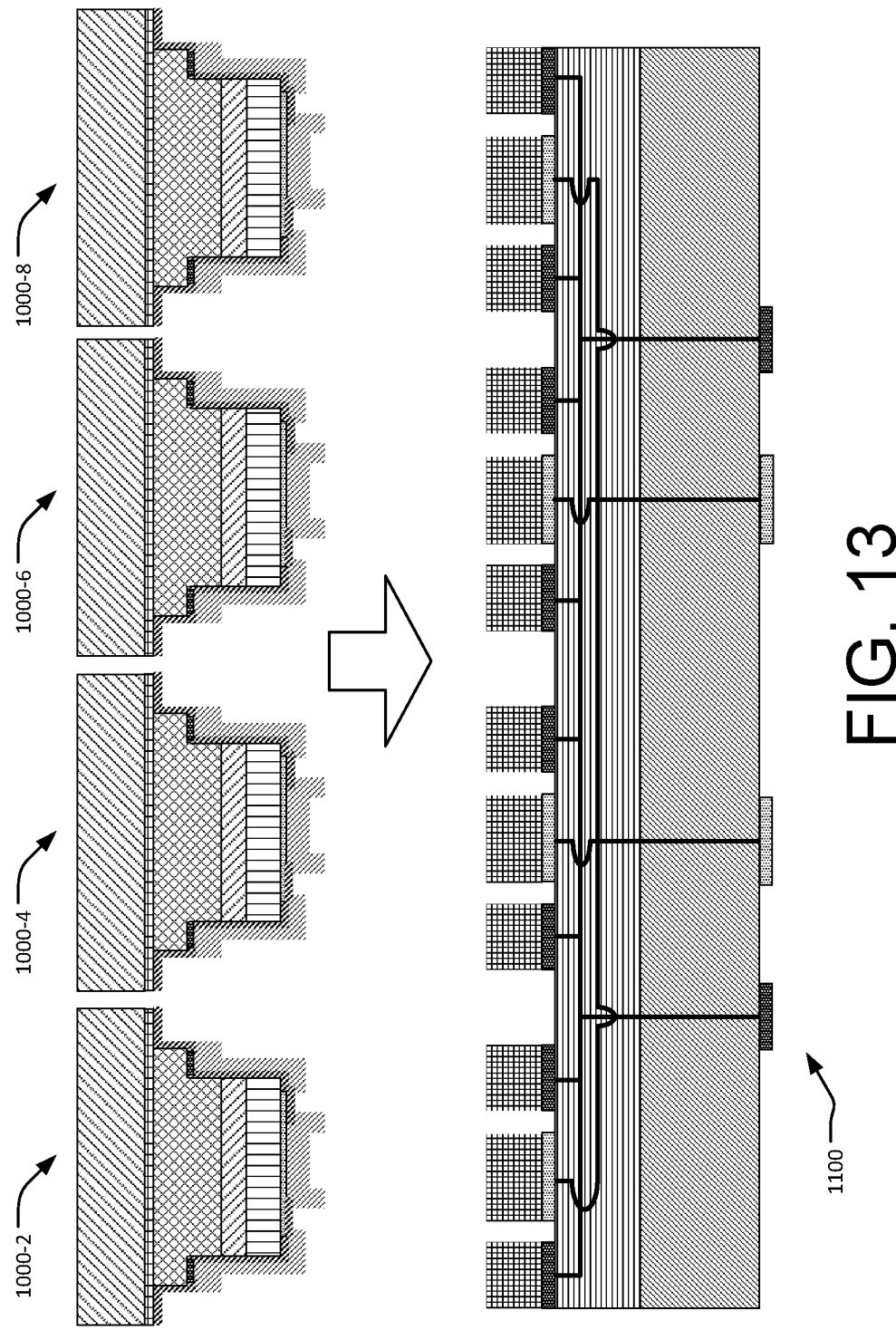
FIG. 13 is a diagram of an example process of aligning and placing KGD-LED components to the mounting substrate to form a plurality of joined KGD-LED components.

FIG. 13 illustrates an example process of aligning and placing the KGD-LED components 1000 to the mounting substrate 1100 to form a plurality of joined KGD-LED components.

In an implementation, the singulated KGD-LED components 1000 are aligned and bonded to the mounting substrate 1100. In this example, the bonding may include soldering such as dipping a flux to the optional solder bump as described in FIG. 9 above. In another implementation, the bonding and electrical connection may be achieved by a mass reflow process, which may be implemented according to the reflow profile of the solder (e.g., SAC 305 or eutectic solder SnPb 63/37).

Figure 14:
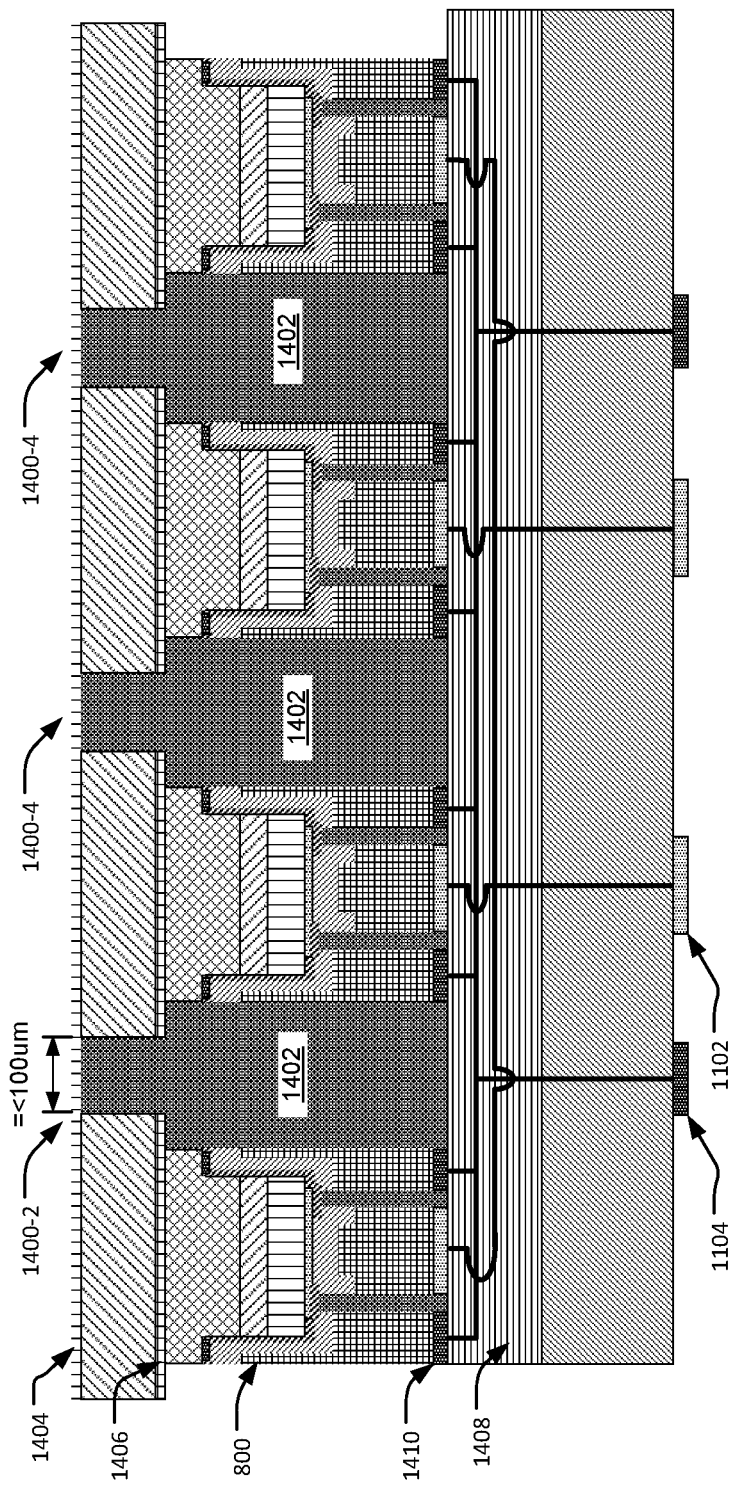
FIG. 14 is a diagram of an example process of filling gaps and spaces in between the mounted KDG-LED components and the mounting substrate.

FIG. 14 illustrates an example process of filling gaps and spaces in between the mounted KDG-LED components 1000 and the mounting substrate 1100. The gaps (i.e., gaps 1400-2, 1400-4, etc.), for example, may include a length and/or width measurement that is large enough to facilitate free flowing of transparent under-filling materials 1402.

In an implementation, the transparent filling material 1402, e.g., silicone or epoxy, SU-8, with or without filler may be inserted into the gaps 1400 that are located in between the mounted KGD-LED components 1000. In this implementation, areas or spaces in between individual KGD-LED component 1000 may be filled as well with the transparent filling material 1402 to prevent voids. The gaps 1400, for example may have about 100 um or less in measurement to make sure that no interruption in the under-filling of transparent filling material 1402 may arise in the process.

For example, a commercially available under-filling material 1402 with 0.2 um size $SiO_2$ particles (n~1.5) dispersed in an epoxy (n~1.4) may be applied at once in the gaps 1400. In this example, the under-filling material 1402 may have a refractive index close to a refractive index of the substrate 102 of the KGD-LED component 1000. For example, a 1.78 refractive index that is close to the refractive index of the sapphire substrate 102 may be utilized as the under-filling transparent material 1402.

For extracting light emitted from sapphire side edges, the transparent filling material 1402 may include a roughened surface after curing process. Furthermore, a roughened upper surface 1404 at a planar surface of the thinned substrate 102 may be formed for further light extraction.

As shown, a patterned lower surface 1406 is formed at an other planar side of the thinned substrate 102. The patterned lower surface 1406 may be disposed in between the thinned substrate 102 and the n-type GaN 104.

In an implementation, the under-filling process may include small particles of metal oxide that may be interspersed within the epoxy matrix. For example, the transparent underfill material 1402 may be applied in a vacuum to ensure proper coverage and then may be cured in a pressurized oven. Once the epoxy or other material is cured, the entire surface may be plasma etched to increase surface roughness, thereby further enhancing the light extraction characteristics of the transparent underfill material 1402.

With continuing reference to FIG. 14, a multi-layer RDL 1408 (or RDL 1408) may facilitate connection of multiple KGD-LED components 1000 to other components, power sources, circuits, or devices. For example, the RDL 1408 may facilitate series and/or parallel connections between the KGD-LED components 1000 to a particular circuitry. In this example, the series and/or parallel connections may be based upon desired intensity of the KGD-LED components 200 because amount of currents may be manipulated through series and/or parallel connections.

FIG. 14 further illustrates a multiple under bump metallization (UBM) layer 1410 that is electrically connected to the probe pads 800. The probe pads 800, for example, may include reflective electrical conductor. The probe pads 800, in this example, may be coupled to the UBM layer 1410 through a solder 1410.

FIG. 15 shows an example process flowchart 1500 illustrating an example method for joining multiple KGD-LED components in a device. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 1502, testing a wafer for KGD-LED component is performed. For example, the KGD-LED component 1000 includes a thinned substrate 102 with a rough upper surface and a patterned lower surface. In this example, the rough upper surface (i.e., about 0.3-3 um in roughness) is disposed on exposed planar surface of the substrate 102 while the patterned lower surface is disposed in between the other planar surface (i.e., opposite side of the rough surface) of the substrate 102 and the n-type GaN 104. The rough surface is utilized, for example, for light extraction while the patterned surface may be utilized to correspond to a desired light wavelength such as 450 nm for blue or 550 nm for green.

At block 1504, flip chip bonding of KGD-LED component onto a substrate is performed. For example, multiple KGD-LED components 1000 are mounted into the mounting substrate 1100. In this example, the mounting substrate 1100 may include the RDL 1408 that facilitates series and/or parallel connections between the mounted KGD-LED components 1000 and a power source of another circuits or operating device.

At block 1506, under-filling a gap and spaces in between the KGD-LED components with a transparent material is performed. For example, the transparent filling material, e.g., silicone or epoxy, SU-8, w/ or w/o filler may be inserted into the gaps 1400 and spaces that are located in between the mounted KGD-LED components 1000. In this example, the transparent filling material covers the gap and spaces in between KGD-LED components 1000 at once to prevent voids. The gaps 1400, for example may have about 100 um or less in measurement to make sure that no interruption in the under-filling flow may arise in the process.

After curing of the formed transparent material, a surface of the formed transparent material is roughened. Furthermore, the formed transparent material is configured to include a refractive index that is close to a refractive index of the thinned substrate 102.

What is claimed is:

1. A method of joining multiple light emitting diode (LED) components, the method comprising:
   testing a wafer for a known good die (KGD)-LED component;
   flip chip bonding multiple KGD-LED components onto a substrate, the substrate includes redistribution layers (RDLs) that facilitate electrical connections between the KGD-LED components and an operating device; and
   under-filling a gap and spaces in between the KGD-LED components with a transparent material, wherein the transparent material is transparent to a light wavelength emitted by the LED components and has a roughened surface that is formed after curing of the under-filling, wherein the gap is equal to or less than 100 micrometers.

2. The method of claim 1, wherein the KGD-LED component includes a thinned sapphire substrate, which has a rough upper surface and a patterned lower surface.

3. The method of claim 2, wherein the rough upper surface is approximately 0.3 to 3 micrometers in roughness.

4. The method of claim 1, wherein the electrical connections facilitated by the RDLs include series or parallel connections.

5. The method of claim 1, wherein the gap dimension between the KGD-LED components, or shape of the KGD or pattern of the KGD or combination thereof are configured to facilitate free flowing of the transparent under-filling material.

6. The method of claim 1, wherein the transparent material has a refractive index close to a refractive index of the substrate that is transparent.

7. A plurality of joined known good die (KGD)-light emitting diode (LED) components comprising:
   a stack of LED layers that include a transparent substrate with a roughened upper surface and a patterned lower surface;
   a reflective electrode coupled to the stack of LED layers;
   a probe pad that is connected to the reflective electrode, wherein the stack of LED layers, the reflective electrode and the probe pad form a single KGD-LED component; and
   a mounting substrate with a redistribution layer (RDL) that connects multiple probe pads of multiple KGD-LED components to an operating device, wherein a transparent under-filling material is formed in a gap and spaces in between the KGD-LED components that are mounted unto the mounting substrate, wherein the transparent material is transparent to a light wavelength emitted by the LED components, wherein the gap is equal to or less than 100 micrometers.

8. The plurality of joined KGD-LED components of claim 7, wherein the RDL facilitates series or parallel connection between the KGD-LED components and the operating device.

9. The plurality of joined KGD-LED components of claim 7, wherein the reflective electrode includes a diffusive reflection at one side and a rough interface to the stack of LED layers at another side.

10. The plurality of joined KGD-LED components of claim 7, wherein the stack of LED layers include a thinned sapphire substrate.

11. The plurality of joined KGD-LED components of claim 7, wherein the gap dimension between the KGD-LED components, or shape of the KGD, or pattern of the KGD, or combination thereof are configured to facilitate free flowing of the transparent under-filling material.

12. The plurality of joined KGD-LED components of claim 7 further comprising a dielectric that at least partially surround the stack of LED layers.

13. The plurality of joined KGD-LED components of claim 7, wherein the transparent under-filling material has a refractive index close to a refractive index of the transparent substrate.

14. A device comprising:
a power source; and
a plurality of joined known good die (KGD)-light emitting diode (LED) components that further comprises:
a stack of LED layers that include a transparent substrate with a roughened upper surface and a patterned lower surface;
a reflective electrode coupled to the stack of LED layers;
a probe pad that is connected to the reflective electrode, wherein the stack of LED layers, the reflective electrode and the probe pad form one KGD-LED component; and
a mounting substrate with a redistributive layer (RDL) that connects multiple probe pads of the plurality of KGD-LED components to the power source, wherein a transparent under-filling material is formed in a gap and spaces in between the KGD-LED components, the transparent under-filling material has a refractive index close to a refractive index of the transparent substrate and is transparent to a light wavelength emitted by the LED components, wherein the gap is equal to or less than 100 micrometers.

15. The device of claim 14, wherein the RDL facilitates series or in parallel connection between the KGD-LED components and the power source.

16. The device of claim 14, wherein the reflective electrode includes a diffusive reflection at one side and a rough interface to the stack of LED layers at another side.

17. The device of claim 14, wherein the stack of LED layers include a thinned sapphire substrate.

* * * * *